US010492339B2

(12) United States Patent
Rogers et al.

(10) Patent No.: US 10,492,339 B2
(45) Date of Patent: Nov. 26, 2019

(54) METHOD OF COOLING A DATA CENTRE AND APPARATUS THEREFOR

(71) Applicant: Bripco BVBA, Antwerp (BE)

(72) Inventors: Paul Rogers, Stanley Pontlarge (GB); Neil Crow, Cheltenham (GB); Lucian Hicks, Cheltenham (GB)

(73) Assignee: Bripco BVBA, Antwerp (BE)

( * ) Notice: Subject to any disclaimer, the term of this patent is extended or adjusted under 35 U.S.C. 154(b) by 84 days.

(21) Appl. No.: 15/574,647

(22) PCT Filed: May 27, 2016

(86) PCT No.: PCT/EP2016/062019
§ 371 (c)(1),
(2) Date: Nov. 16, 2017

(87) PCT Pub. No.: WO2016/193153
PCT Pub. Date: Dec. 8, 2016

(65) Prior Publication Data
US 2018/0139868 A1 May 17, 2018

(30) Foreign Application Priority Data

May 29, 2015 (GB) .................................. 1509346.1

(51) Int. Cl.
*F24F 3/14* (2006.01)
*B01F 3/04* (2006.01)
*H05K 7/20* (2006.01)

(52) U.S. Cl.
CPC ..... *H05K 7/20745* (2013.01); *B01F 3/04014* (2013.01); *B01F 3/04021* (2013.01);
(Continued)

(58) Field of Classification Search
CPC .... B01F 3/04; B01F 3/04014; B01F 3/04021; F24F 3/12; F24F 3/14
(Continued)

(56) References Cited

U.S. PATENT DOCUMENTS 8,080,127 B2 * 12/2011 Chen .................. B01D 1/14
159/16.1
2009/0158928 A1 6/2009 Wu et al.
(Continued)

FOREIGN PATENT DOCUMENTS

FR 2982936 A1 5/2013
GB 2326938 A 1/1999
(Continued)

OTHER PUBLICATIONS

GB Intellectual Property Office Search Report, search dated Nov. 4, 2015.
(Continued)

*Primary Examiner* — Robert A Hopkins
(74) *Attorney, Agent, or Firm* — Carlos A. Fisher; Stout, Uxa & Buyan, LLP

(57) ABSTRACT

A method of providing cooling air for cooling data centre IT equipment, an evaporative humidifier and an air handling unit is disclosed. The method comprises operating an evaporative humidifier (201) to humidify air for supply as IT equipment cooling air, the evaporative humidifier preferably comprising a deformable wettable matrix (207). Preferably, the method comprises steps of wetting the deformable wettable matrix (207), passing air through the wetted matrix (207) thus producing humidified air, and expelling water from the wettable matrix (207) by subjecting the wettable matrix to compressive deformation. The evaporative humidifier (201) preferably comprises a compressible wettable matrix (207), a water reservoir (217), a pump (218) for
(Continued)

supplying water from the reservoir (217) to the wettable matrix (207), a frame for supporting the compressible wettable matrix, and an actuator (211) for effecting a compressive force on the compressible wettable matrix (207) for the purpose of expelling water from the wettable matrix (207). The air handling unit preferably comprises an evaporative humidifier (201) as disclosed.

26 Claims, 4 Drawing Sheets

(52) U.S. Cl.
CPC ........... *F24F 3/14* (2013.01); *H05K 7/20536* (2013.01); *H05K 7/20709* (2013.01)

(58) Field of Classification Search
USPC .................................................... 261/94, 98
See application file for complete search history.

(56) References Cited

U.S. PATENT DOCUMENTS

| | | |
|---|---|---|
| 2013/0186611 A1 | 7/2013 | Schneider |
| 2013/0213076 A1 | 8/2013 | Gerlach |
| 2013/0320573 A1 | 12/2013 | Fisher et al. |

FOREIGN PATENT DOCUMENTS

| | | |
|---|---|---|
| GB | 2464284 A | 4/2010 |
| WO | 03058141 A1 | 7/2003 |
| WO | 2011148175 A2 | 12/2011 |

OTHER PUBLICATIONS

GB Intellectual Property Office Further Search Report, dated Jun. 9, 2016.
International Search Report, dated Aug. 29, 2016.
Examination Report, application No. 16726524.8-1203, dated Jun. 11, 2019.

\* cited by examiner

METHOD OF COOLING A DATA CENTRE AND APPARATUS THEREFOR

FIELD OF THE INVENTION

The present invention relates to a method of cooling a data centre using humidified air and apparatus therefor.

BACKGROUND OF THE INVENTION

Data centres typically generate high levels of internal heat. It is therefore necessary to provide cooling means in order to keep the IT equipment that they house functioning within the prescribed environmental limits.

Adiabatic cooling is used in known data centre cooling systems because it can substantially increase the power efficiency of the data centre relative to the use of other cooling means, for example DX cooling, thereby substantially reducing operating costs.

Air is cooled adiabatically by humidification: water is exposed to warm air and energy is transferred from the warm air to the water resulting in the water transforming from a liquid to a gaseous state. This process results in humidified air of lower temperature than the original warm air, with no heat energy having been added or removed from the system.

In order for adiabatic cooling to be most effective, the rate of evaporation of water should be maximised; this is achieved by maximising the surface area of water exposed to the air flow that requires cooling. Known adiabatic cooling systems maximise this surface area by spraying a water mist into the air or by passing the air through a wettable matrix.

A problem related to the use of wettable matrix evaporative humidifiers is retention of water within the wettable matrix after the water supply has been cut-off; there is a time lag between the command for dry air being given and dry air being delivered to the data centre. This time lag directly affects the accuracy with which the data centre temperature and humidity levels can be controlled and can result in over cooling of the data centre.

When an evaporative humidifier is used in conjunction with DX cooling, the problem of over humidification could be reduced by enabling a 'dehumidification mode'; this, however, would be very power intensive.

A cooling method proposed in WO2011/148175 suggests the use of automated dampers to bypass the evaporative humidifier which might mitigate the effects of the time lag, but it is believed that there is scope for yet further improvement on how the humidity levels can be controlled.

The present invention seeks to mitigate one or more of the above-mentioned problems. Alternatively or additionally, the present invention seeks to provide a method for providing cooling air of closely controlled humidity to a data centre and apparatus therefor.

SUMMARY OF THE INVENTION

The present invention provides a method of providing cooling air for cooling IT equipment in a data centre. The method comprises a step of operating an evaporative humidifier to humidify air for supply as cooling air to the IT equipment. The evaporative humidifier comprises a deformable wettable matrix. There may be a step of wetting the deformable wettable matrix. The method includes a step of passing air through the wetted matrix thus producing humidified air. The method includes a step of expelling water from the wettable matrix by subjecting the wettable matrix to a compressive deformation.

The humidity of the air delivered by an evaporative humidifier is determined by, amongst other factors, the surface area of water that the air passes over when passing through the evaporative humidifier, as will be well understood by the skilled person. A wettable matrix, when wetted, may provide a large surface area of water for air to pass over and can thus provide a high rate of humidification of air when used in an evaporative humidifier. If the wettable matrix is deformable, water can be quickly removed from the deformable wettable matrix by subjecting it to a compressive deformation. Thus an evaporative humidifier with a deformable wettable matrix can advantageously be arranged for close control of the humidity of air it delivers. Use of such an evaporative humidifier for the supply of cooling air to a data centre can advantageously avoid over-humidification of the air and/or over-cooling of the air supplied to the IT equipment within the data centre. If the air supplied to the IT equipment to keep such IT equipment from over-heating is not kept within certain ranges of temperature and humidity, there is an increased risk of damage or temporary inoperability of the IT equipment. Enabling closer (more precise) control of the humidity of air supplied by an evaporative humidifier within a data centre may also improve efficiency.

The humidifying of the air is preferably a substantially adiabatic process.

The cooling air supplied to the IT equipment may include a mixture of (a) humidified air that has passed via the wettable matrix when wetted and (b) bypass air that has bypassed the wettable matrix when wetted, such that the humidity of the bypass air is not increased. The amount of air bypassing the wettable matrix may be controllable. It may be that some air could be arranged to bypass the evaporative humidifier completely. It is preferred however for at least some (preferably substantially all) of the bypass air to pass through the evaporative humidifier. It may be that some or all of the air bypassing the wetted wettable matrix may pass via a dry portion of wettable matrix in the humidifier. It may be that some or all of the air bypassing the wetted wettable matrix passes through the evaporative humidifier without passing through any portion of any wettable matrix, whether dry or not, of the evaporative humidifier.

The method may include a step of moving the wettable matrix to change the cross-sectional area of the bypass airflow path.

It may be that compressing the wettable matrix to expel water may open up the bypass airflow path. However, it has been found that the time taken to fully expel the water held by the wettable matrix may be sufficiently short that the presence of a bypass airflow path does not disrupt the cooling of the datacentre. It may be that the step of expelling water from the wettable matrix is effected in less than 60 seconds, possibly less than 20 seconds.

The method may include a step of moving the wettable matrix to change the cross-sectional area of the airflow path for air that passes via the wettable matrix.

The evaporative humidifier may comprise more than one wettable matrix. There may be two or more wettable matrixes, for example. Such wettable matrixes are preferably provided in parallel (i.e. not in series). Such wettable matrixes are preferably independently compressible. Having many independently compressible wettable matrixes may facilitate yet finer control over the amount of humidification effected by the humidifier. Each such wettable matrix may be in the form of a wettable matrix in accordance with any aspect of the present invention as claimed or described herein, optionally including any related optional features.

It may be that more than one evaporative humidifier is used to humidify air for supply as cooling air to the data centre. There may be two or more evaporative humidifiers, for example. Such wettable matrixes are preferably provided in parallel.

The step of expelling water from the wettable matrix may be achieved by subjecting the wettable matrix to a compressive deformation that reduces the cross-sectional area of the airflow path for air that passes via the wettable matrix. It may for example be that the wettable matrix is compressed in a direction that is substantially perpendicular to the flow of air through the wettable matrix.

It may that the wettable matrix is directly compressed, for example by means of a platen.

It may be that air from outside the data centre is supplied to the evaporative humidifier. It may be that the air from outside the data centre supplied to the evaporative humidifier is fresh air (taken from atmospheric air). Such air may be filtered before being supplied to the evaporative humidifier. Such fresh air may be mixed with air from within the data centre, for example recirculated air.

It may be that air within the data centre is recirculated so that air from the IT equipment in the data centre (exhaust air) is supplied to the evaporative humidifier.

It may be that such recirculated air is mixed with other air (for example from outside the data centre) before being supplied to the evaporative humidifier.

The output of the evaporative humidifier may be controlled by means of a control system. For example, the output of the evaporative humidifier may be controlled by means of one or more command signals received from such a control system. The control system will typically be provided separately, at least in part, from the evaporative humidifier.

The output of the evaporative humidifier may be controlled in response to measurements of air humidity and air temperature made by one or more sensors. One such measurement may be of the humidity of air outside the data centre. One such measurement may be of the temperature of air outside the data centre. One such measurement may be of the humidity of air inside the data centre, for example before and/or after being used to cool the IT equipment. One such measurement may be of the temperature of air inside the data centre, for example before and/or after being used to cool the IT equipment.

The output of the evaporative humidifier may be controlled by means of setting a desired amount of humidity to be added to the incoming air (for example, so that the resultant output air has a particular level of humidity). A desired humidity (or increase in humidity) may be so achieved by configuring the evaporative humidifier by means of relating the desired amount of humidity to a particular configuration by means of a look-up table.

As mentioned above, the step of passing air through the wettable matrix so wetted may be conducted in response to a command signal from a control system. There may be a subsequent command signal from the control system requiring less cooling to be provided by the evaporative humidifier. Such a subsequent command signal may result in the performance of the step of expelling water from the wettable matrix.

The step of expelling water from the wettable matrix may cause more than two thirds of the water held by the wettable matrix to be expelled. The step of expelling water from the wettable matrix may cause substantially all of the water held by the wettable matrix to be expelled. For example it may be that the step of expelling water from the wettable matrix is effected by means of fully compressing the wettable matrix. It may be that the step of expelling water from the wettable matrix expels at least 80% of the water held by the wettable matrix. It may be that the step of expelling water from the wettable matrix expels at least 90% of the water held by the wettable matrix.

It may be that immediately after the step of expelling water from the wettable matrix by means of subjecting the wettable matrix to the compressive deformation, the wettable matrix is extended. It may be that the step of extending the wettable matrix is effected in less than 60 seconds, possibly less than 20 seconds. It may thus be possible to fully compress the wettable matrix from a configuration in which the wettable matrix is fully wetted and fully extended, thus expelling the water held by the wettable matrix, and then extend the wettable matrix back to its full extension in less than 2 minutes and possibly less than 40 seconds.

It may be that immediately after the step of expelling water from the wettable matrix by means of subjecting the wettable matrix to the compressive deformation, the wettable matrix remains compressed in a bypass configuration, thus providing a bypass airflow path (for example, as described above). It may be that, in certain conditions, for example, the wettable matrix remains in a bypass configuration for more than 2 minutes.

There may be a step of collecting water that has been expelled from the wettable matrix. Such collected water may be stored, for example in a reservoir. Such collected water may subsequently be fed back into the wettable matrix and thus reused.

According to a second aspect of the invention, there is provided a method of providing cooling air for cooling IT equipment in a data centre, in which the wettable matrix is not necessary compressible but which nevertheless offers finer control of the humidification effected by a humidifier. Such a method may comprise a step of operating, in response to a first command signal from a control system, an evaporative humidifier to humidify air for supply as cooling air to the IT equipment. This is achieved by passing air through a moveable section of wetted matrix of the evaporative humidifier. The section of wetted matrix is positioned in a first position and presents an air-flow route having a first cross-sectional area. The method also includes, for example in response to a second command signal from the control system, a step of moving the section of wetted matrix of the evaporative humidifier to a second position so that the section presents an air-flow route having a second cross-sectional area, different from the first cross-sectional area.

When the section of wetted matrix of the evaporative humidifier is in the second position a bypass airflow path may be presented. It may be that when the section of wetted matrix of the evaporative humidifier is in the first position there is no such bypass airflow path (for example the bypass airflow path may be closed off, for example by means of the section of wetted matrix).

It may be that when the section of wetted matrix of the evaporative humidifier is in the first position there is presented a bypass airflow path having a cross-sectional area that is less than the cross-sectional area of the bypass airflow path that is presented when the section of wetted matrix is in the second position.

It may be that movement of the section of wetted matrix from the first position to the second position compresses the wetted matrix.

There may, in a similar manner to the first aspect of the invention, be a step of expelling water from the wettable matrix by subjecting the wettable matrix to a compressive deformation. The actuator may comprise, or be in the form of, a belt drive system, a chain-drive system, a hydraulic ram system, a screw-driven system, or the like.

According to a third aspect of the invention there is provided an evaporative humidifier configured for use as the evaporative humidifier used in the method in accordance with any aspect of the present invention as claimed or described herein, optionally including any related optional features. Such an evaporative humidifier may comprise a compressible wettable matrix. Such an evaporative humidifier may comprise a reservoir for water. Such an evaporative humidifier may comprise a pump for supplying water from such a reservoir to the wettable matrix. Such an evaporative humidifier may comprise a frame for supporting the compressible wettable matrix. Such an evaporative humidifier may comprise an actuator for effecting a compressive force on the compressible wettable matrix for the purpose of expelling water from the wettable matrix.

It may be that the reservoir is arranged to be fed, at least in part, with a water supply, for example a mains water supply. It may be that the reservoir is arranged to be fed, at least in part, with water that is expelled from the wettable matrix.

The frame may comprise a mesh that contains the compressible wettable matrix whilst allowing air to pass via the mesh and through the wettable matrix during use so as to allow air to be humidified.

Such an evaporative humidifier may comprise a platen, for example a pressure plate, for exerting the compressive force on the compressible wettable matrix. The platen may be arranged to be actuated by means of the actuator.

The compressible wettable matrix comprises a compressible foam material. The foam material may comprise open pores. It may be that the compressible foam material is in the form of a sponge-like material.

According to a fourth aspect of the invention there is provided an air handling unit for a data centre, the air handling unit being configured for supplying cooling air for supply to IT equipment within a data centre. The air handling unit comprises an evaporative humidifier according to any aspect of the present invention as claimed or described herein, optionally including any related optional features. The air handling unit may comprise one or more fans. The air handling unit may comprise one or more mechanical air cooling units, for example DX cooling units.

According to a fifth aspect of the invention there is provided a data centre including IT equipment and an air handling unit according to any aspect of the present invention as claimed or described herein, optionally including any related optional features. The air handling unit of the data centre is thus arranged to supply cooling air to the IT equipment of the data centre.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of evaporative humidifiers for use in the methods of the present invention will now be described by way of example only with reference to the accompanying schematic drawings of which.

DETAILED DESCRIPTION

Figure 1:
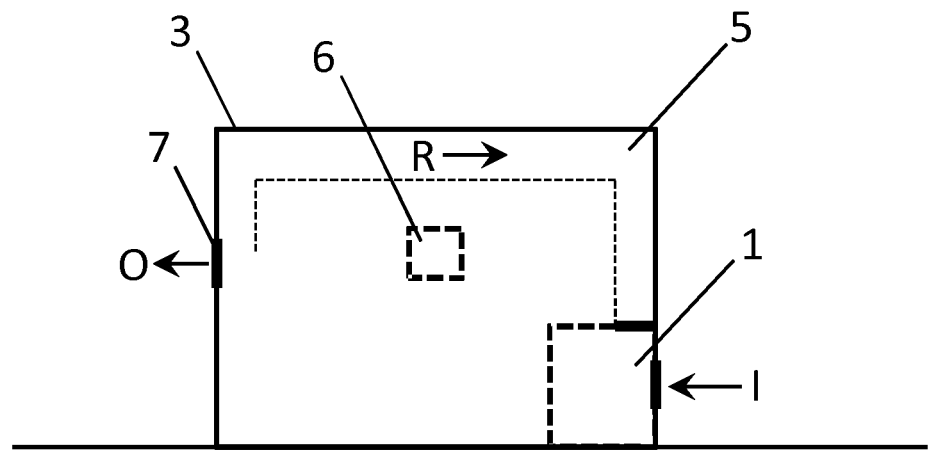
FIG. 1 shows a schematic of a data centre arranged to be adiabatically cooled by an evaporative humidifier.

FIG. 1 shows schematically an evaporative humidifier 1 situated within a data centre 3 and arranged such that, in use, it provides humidified air for adiabatic cooling of IT equipment in the data centre 3. Air can be supplied to the evaporative humidifier 1 either from the outside, as indicated by the arrow labelled I, or from within the data centre 3 itself via an air recycling duct 5, as indicated by the arrow labelled R. Air exiting the humidifier 1 is passed directly into the data centre 3.

The temperature and humidity of the air within the data centre 3 is monitored by an environmental monitor and control system 6 that is arranged to control the output of the humidifier 1 to ensure that the temperature and humidity of the air within the data centre is kept within specified limits. The control system not only controls the humidity of air leaving the humidifier 1, but also decides if air is recycled via the recycling duct 5 or passed out of the data centre 3 via the outlet 7 in the direction of the arrow labelled O.

The following paragraphs describe various possible embodiments of the evaporative humidifier 1 for the supply of humidified air for adiabatic cooling of IT equipment in the data centre 3.

Figure 2:
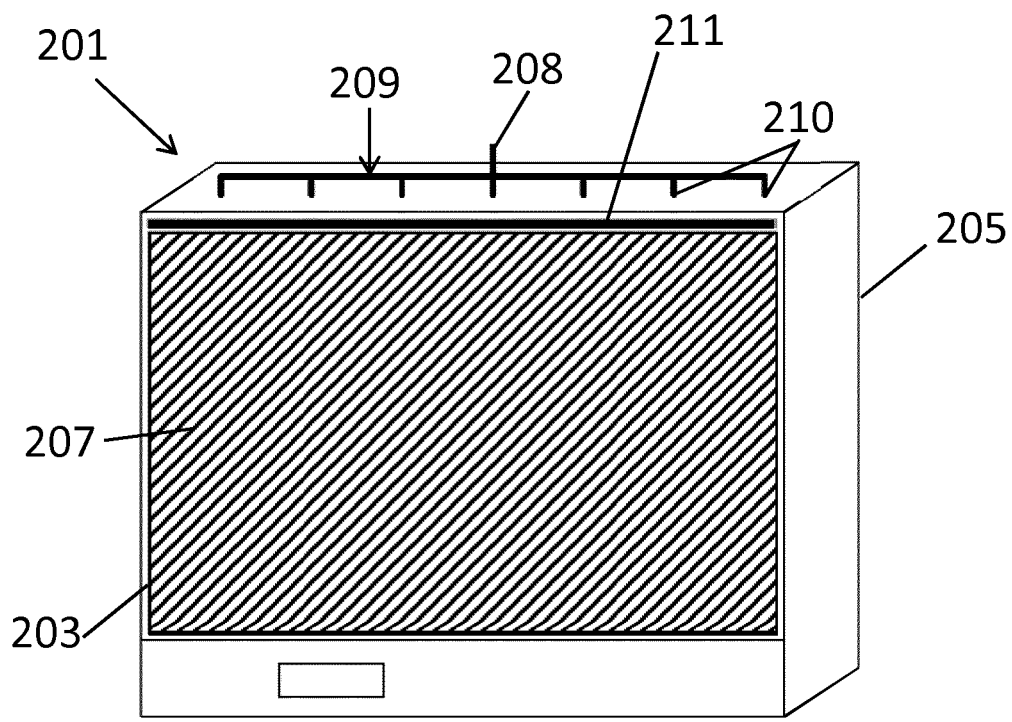
FIG. 2 shows a first embodiment of an evaporative humidifier comprising a deformable wettable matrix.

FIG. 2 shows a first embodiment of an evaporative humidifier 201. The humidifier 201 comprises an aperture that serves as an air inlet 203 on a first side, an aperture that serves as an air outlet 205 on a second side, and a deformable wettable matrix 207 positioned between the air inlet 203 and the air outlet 205. The wettable matrix 207 in its undeformed state fills the space between air inlet 203 and the air outlet 205 such that any air passing through the humidifier 201 must pass through the wettable matrix 207. A pipe network 209 with an inlet 208 connected to a water source (not shown) has several outlets 210 that feed water into the wettable matrix 207 at top of the humidifier 201. The outlets 210 are evenly spaced along the width of the humidifier 201 so that water can be evenly distributed along the width of the wettable matrix 207.

Figure 3:
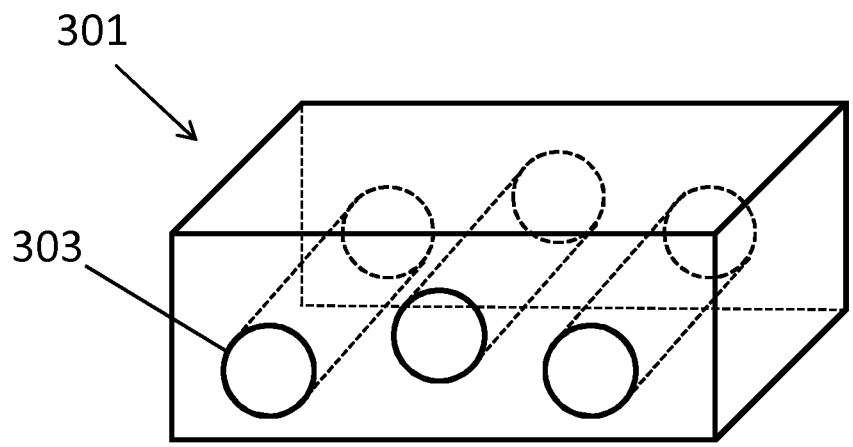
FIG. 3 shows a section of wettable matrix material as viewed under a microscope.

FIG. 3 shows a schematic of the wettable matrix material 301 as viewed under a microscope. The wettable matrix material 301 contains pores 303 in which water can be stored and through which air can pass. Thus the wettable matrix provides a large surface area over which evaporative humidification can take place.

Figure 4:
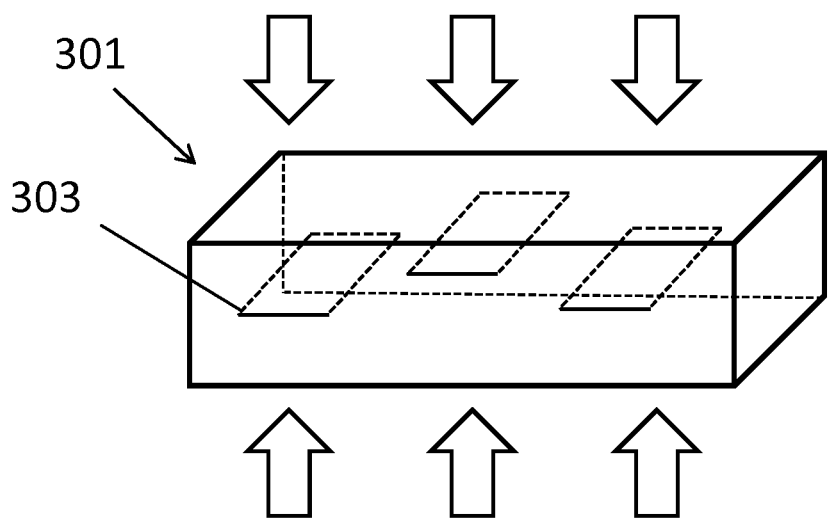
FIG. 4 shows the section of wettable matrix material shown in FIG. 3 subjected to a compressive deformation.

FIG. 4 shows a schematic of the wettable matrix material 301 shown in FIG. 3 subjected to a compressive deformation in the direction of the arrows shown in the figure. The network of pores 303 has closed under the compressive load such that no water can be stored within and no air can pass through the wettable matrix material 301. Thus compressive deformation expels water stored within of the wettable matrix material and provides an indirect method for controlling the humidity of air leaving the evaporative humidifier 201.

Whilst the wettable matrix in this particular embodiment consists of a porous sponge-like material, it will be appreciated that the wettable matrix may comprise any material or structure able to store water in a manner that facilitates evaporative humidification and that is deformable in a manner that expels stored water.

The humidity of the air leaving the air outlet 205 of the humidifier 201 is controlled by controlling the amount of water that is stored within the network of pores 303 within the wettable matrix 207. Water can be added to the wettable matrix via the pipe network 209 and water can be removed from the wettable matrix 207 by compressively deforming it.

Figure 5:
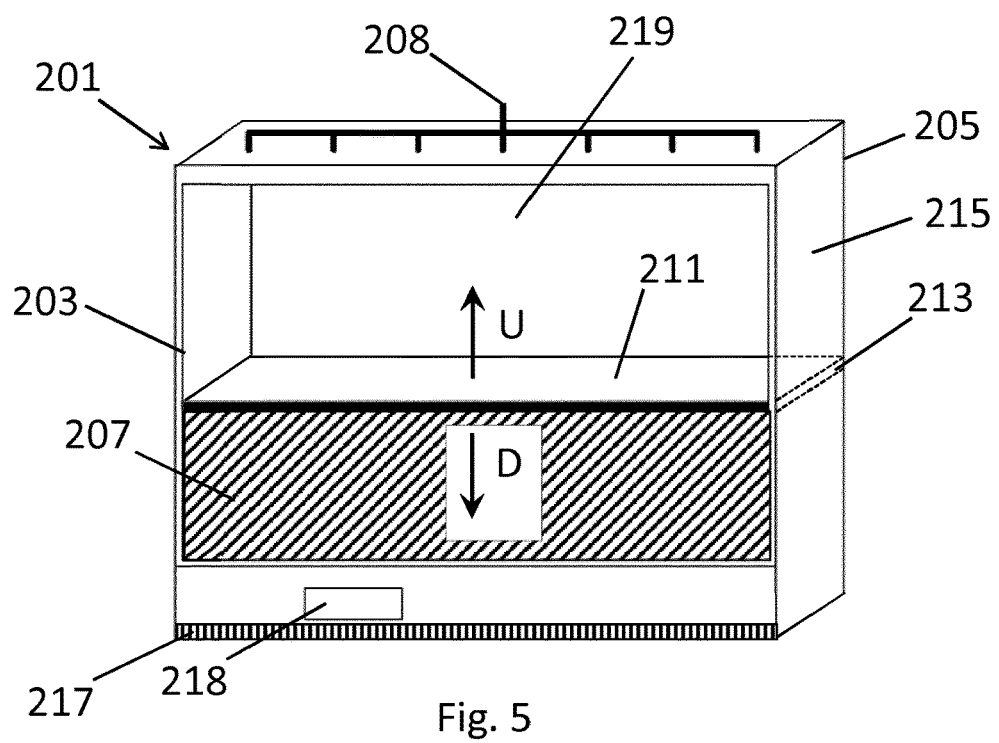
FIG. 5 shows the evaporative humidifier of FIG. 2 as the wettable matrix is being subjected to a compressive deformation.

FIG. 5 shows the first embodiment of the humidifier 201 in a state where the wettable matrix 207 is subjected to a compressive deformation under the action of a platen 211. The upper most edge of the wettable matrix 207 is attached to the platen 211. Widthways, the platen 211 spans the internal width of the humidifier. Lengthways, the platen 211 spans the thickness of the wettable matrix which in this embodiment is approximately equal to the distance between the air inlet 203 and the air outlet 205. The two ends of the platen 211 that meet the two internal side walls of the humidifier are each fixed to a belt-drive system 215 located in each of the two the side walls of the humidifier 201. The belt drive systems 215 are arranged such that they are operable to vertically actuate the platen in a direction that is substantially perpendicular to the flow of air into the air inlet 203. To subject the wettable matrix 207 to a compressive deformation, the belt drive systems 215 are operated to move the platen 211 in the direction indicated by the arrow D. Compressive deformation of the wettable matrix 207 results in water being expelled from the pores within the wettable matrix 207 and passed, under the influence of gravity, to a collection tank 217 located beneath the wettable matrix 207.

In this particular embodiment, the water that is collected in the collection tank 217 is pumped by a pump 218 such that it can be fed back into the water inlet 208 and recycled within the system as needed.

The cross sectional areas of the air inlet 203 and the air outlet 205 remain constant during compression of the wettable matrix 207 such that a bypass conduit 219, the floor of which is defined by the platen 211, is formed above the compressed wettable matrix 207. The volume of the bypass conduit 219 is equal to the reduction in volume of the wettable matrix 207.

To expel all of the water stored within the wettable matrix 207, the platen 211 is actuated such that it compresses the wettable matrix 207 to the point where its apparent porosity approaches zero and the volume of the bypass conduit 219 approaches the volume of the undeformed wettable matrix 207.

Once the desired amount of water has been expelled from the wettable matrix 207 by compressive deformation, the belt-drive systems 215 actuate the platen 211 in the direction of the arrow labelled U to extend the wettable matrix 207 and return it to its undeformed position shown in FIG. 2.

Figure 6:
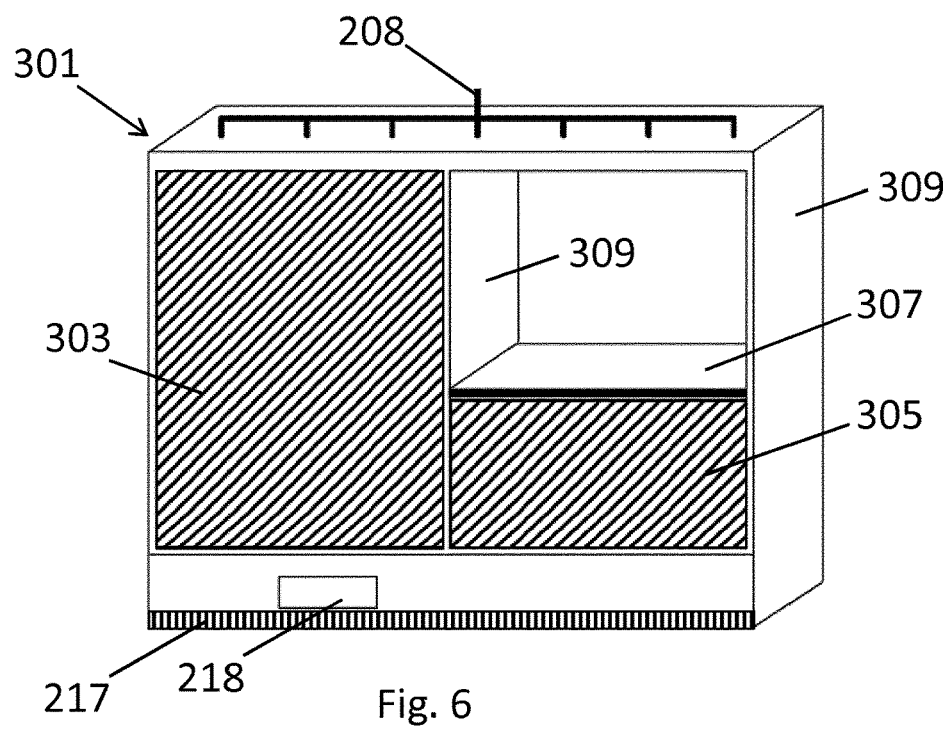
FIG. 6 shows a second embodiment of an evaporative humidifier having a first and a second deformable wettable matrix arranged in parallel.

A second embodiment of an evaporative humidifier 301, based closely on the first embodiment of an evaporative humidifier 201, is shown in FIG. 6. In the second embodiment of the humidifier 301, the wettable matrix 207 of the first embodiment of the humidifier 201 has been divided into two sections such that the humidifier 301 now comprises a first wettable matrix 303 and a second wettable matrix 305. The first wettable matrix 303 and the second wettable matrix 305 are arranged in parallel across the width of the humidifier such that they are side by side and independently actuatable via two separate platen 307 and belt drive 309 systems implemented as already described for the first embodiment shown in FIG. 2 and FIG. 5. In FIG. 6 the second wettable matrix 305 is being subjected to a compressive deformation while the first wettable matrix 303 remains undeformed. It will be understood by the skilled person that such an arrangement advantageously increases the precision with which the humidity of air leaving the humidifier 301 can be controlled. For example, the first wettable matrix 303 may be dry and the second wettable matrix 305 may be wetted such that air of relatively low humidity can be produced by mixing dry air exiting the first wettable matrix 303 with humid air exiting the second wettable matrix 305.

Figure 7:
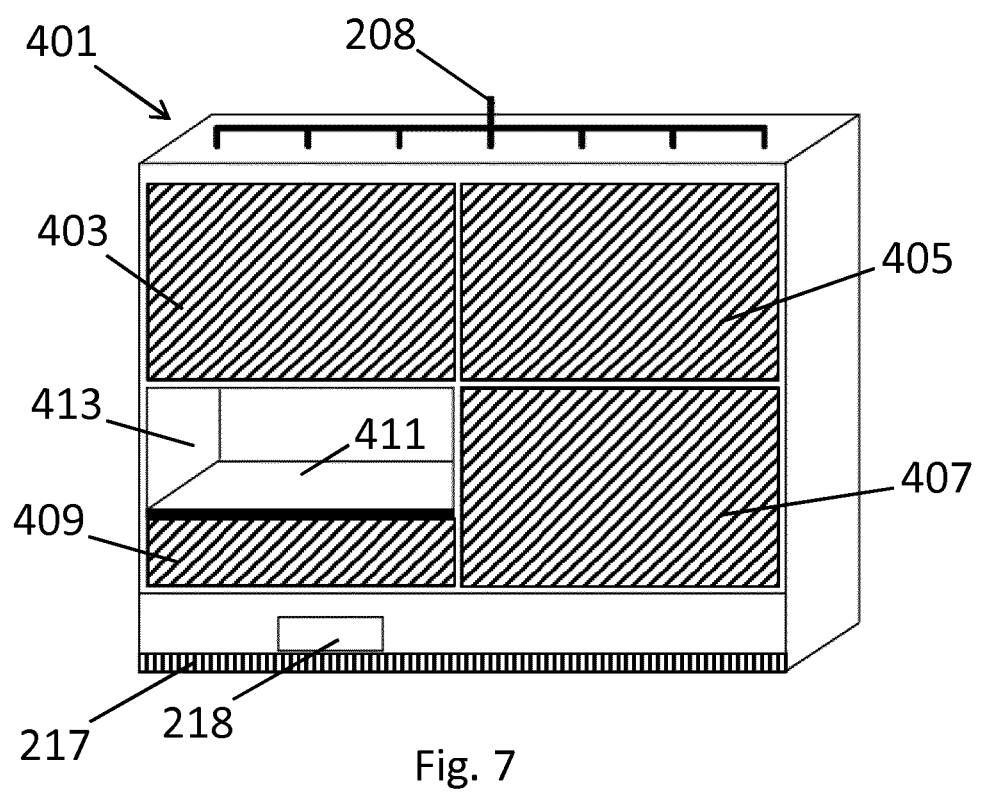
FIG. 7 shows a third embodiment of an evaporative humidifier having a first, a second, a third, and a fourth deformable wettable matrix arranged in parallel.

In a third embodiment of the evaporative humidifier 401 shown in FIG. 7, based closely on the first 201 and second 301 embodiments shown in FIG. 2 and FIG. 6 respectively, a first wettable matrix 403, a second wettable matrix 405, a third wettable matrix 407, and a fourth wettable matrix 409 are arranged in parallel as a two by two array. Each wettable matrix is independently actuatable via platen 411 and belt drive 413 systems implemented as already described for the first embodiment. In FIG. 7 the fourth wettable matrix 409 is subjected to a compressive deformation while the other wettable matrixes 403, 405, 407 remain undeformed.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

In a fourth embodiment of the evaporative humidifier, based closely on the second embodiment of an evaporative humidifier 301, a first wettable matrix and a second wettable matrix are arranged in parallel and spaced vertically such that the first wettable matrix sits above the second wettable matrix, both wettable matrixes being independently actuatable via separate platen and belt drive systems.

It will be understood by the skilled person that for an evaporative humidifier with a given cross sectional area of wettable matrix, the degree of precision with which the humidity of air exiting said humidifier can be controlled can be increased by division of the wettable matrix into independently wettable and actuable sections such that a fifth embodiment of the evaporative humidifier comprises five independently actuatable wettable matrixes and a sixth embodiment comprises six independently actuatable wettable matrixes and so on.

It will also be understood by the skilled person that where an embodiment of the humidifier comprises more than one wettable matrix, an equivalent embodiment may be constructed by arranging an equivalent array of evaporative humidifiers 201 of appropriate size and geometry in parallel.

In a further embodiment of the evaporative humidifier based closely on the already described embodiments, the platen is screw-driven rather than actuatable via the use of belt drives. In another embodiment the platen is chain-driven. In another embodiment the platen is driven by hydraulic actuators.

The wettable matrix may instead comprise a reticulated polyurethane foam. The matrix may have voids that are formed by a foam structure. Larger voids may be provided—for example, in the form of passageways, from one side of the matrix to the other.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of providing cooling air for cooling IT equipment in a data centre, wherein the method comprises the steps of:
    operating an evaporative humidifier to humidify air for supply as cooling air to the IT equipment, the evaporative humidifier comprising a deformable wettable matrix;
    wetting the deformable wettable matrix to form a wetted deformable matrix;
    passing air through the wetted deformable matrix; and
    expelling water from the wetted deformable matrix by subjecting the wetted deformable matrix to a compressive deformation.

2. A method according to claim 1 wherein the cooling air supplied to the IT equipment includes a mixture of humidified air that has passed through the wetted deformable matrix and bypass air that has bypassed the wetted deformable matrix, such that the humidity of the bypass air is not increased.

3. A method according to claim 2 wherein at least some of the bypass air passes through the evaporative humidifier.

4. A method according to claim 3 wherein at least some of the bypass air that passes through the evaporative humidifier does so without passing through any portion of any wetted deformable matrix of the evaporative humidifier.

5. A method according to claim 3 wherein the method includes a step of moving the wetted deformable matrix to change the cross-sectional area of the bypass airflow path.

6. A method according to claim 1, wherein the method includes a step of moving the wetted deformable matrix to change the cross-sectional area of the airflow path for air that passes via the wetted deformable matrix.

7. A method according to claim 1 wherein the evaporative humidifier comprises more than one wettable matrix.

8. A method according to claim 1 wherein more than one evaporative humidifier is used to humidify air for supply as cooling air to the data centre.

9. A method according to claim 1 wherein the step of expelling water from the wetted deformable matrix is achieved by subjecting the wetted deformable matrix to a compressive deformation that reduces the cross-sectional area of the airflow path for air that passes through the wetted deformable matrix.

10. A method according to claim 1 wherein the output of the evaporative humidifier is controlled by means of one or more command signals received from a control system.

11. A method according to claim 1 wherein the output of the evaporative humidifier is controlled in response to measurements of air humidity and air temperature made by one or more sensors.

12. A method according to claim 1, wherein the step of passing air through the wetted deformable matrix is conducted in response to a command signal from a control system, and a subsequent command signal from the control system requiring less cooling to be provided by the evaporative humidifier causes the step of expelling water from the wetted deformable matrix.

13. A method according to claim 1, wherein the step of expelling water from the wetted deformable matrix causes substantially all of the water held by the wetted deformable matrix to be expelled.

14. A method according to claim 1, wherein immediately after the step of expelling water from the wetted deformable matrix by means of subjecting the wetted deformable matrix to the compressive deformation, the wetted deformable matrix is extended.

15. A method according to claim 1 wherein water expelled from the wetted deformable matrix is collected and fed back into a wettable matrix.

16. An evaporative humidifier configured for use as the evaporative humidifier used in the method as described by claim 1.

17. An evaporative humidifier according to claim 16, comprising:
    a compressible wettable matrix,
    a reservoir for water,
    a pump for supplying water from the reservoir to the wettable matrix,
    a frame for supporting the compressible wettable matrix, and
    an actuator for effecting a compressive force on the compressible wettable matrix for the purpose of expelling water from the wettable matrix.

18. An evaporative humidifier according to claim 17, wherein the frame comprises a mesh that contains the compressible wettable matrix whilst allowing air to pass via the mesh and through the wettable matrix during use so as to allow air to be humidified.

19. An evaporative humidifier according to claim 17, further including a platen for exerting the compressive force on the compressible wettable matrix the platen being arranged to be actuated by means of the actuator.

20. An evaporative humidifier according to claim 17, wherein the compressible wettable matrix comprises a compressible foam material.

21. An air handling unit for a data centre, the air handling unit being configured for supplying cooling air for supply to IT equipment within a data centre, wherein the air handling unit comprises an evaporative humidifier according to claim 16.

22. An air handling unit according to claim 21, wherein the air handling unit further comprises one or more fans.

23. An air handling unit according to claim 21, wherein the air handling unit further comprises one or more mechanical air cooling units.

24. A data centre including IT equipment and an air handling unit according to claim 21, the air handling unit being arranged to supply cooling air to the IT equipment.

25. A method of providing cooling air for cooling IT equipment in a data centre, wherein the method comprises the steps of:

in response to a first command signal from a control system, operating an evaporative humidifier to humidify air for supply as cooling air to the IT equipment, by passing air through a moveable section of wetted matrix of the evaporative humidifier, the section being positioned in a first position and presenting an air-flow route having a first cross-sectional area;

in response to a second command signal from a control system, moving the section of wetted matrix of the evaporative humidifier to a second position so that the section presents an air-flow route having a second cross-sectional area, different from the first cross-sectional area.

26. An evaporative humidifier configured for use as the evaporative humidifier used in the method as described in claim 25.

* * * * *